United States Patent
Qiu et al.

(10) Patent No.: US 9,324,884 B1
(45) Date of Patent: Apr. 26, 2016

(54) METAL OXYNITRIDE DIODE DEVICES

(71) Applicants: Cindy X. Qiu, Brossard (CA); Andy Shih, Brossard (CA); Yi-Chi Shih, Los Angeles, CA (US); Ishiang Shih, Brossard (CA); Chunong Qiu, Brossard (CA); Julia Qiu, Brossard (CA)

(72) Inventors: Cindy X. Qiu, Brossard (CA); Andy Shih, Brossard (CA); Yi-Chi Shih, Los Angeles, CA (US); Ishiang Shih, Brossard (CA); Chunong Qiu, Brossard (CA); Julia Qiu, Brossard (CA)

( * ) Notice: Subject to any disclaimer, the term of this patent is extended or adjusted under 35 U.S.C. 154(b) by 0 days.

(21) Appl. No.: 14/544,752

(22) Filed: Feb. 12, 2015

(51) Int. Cl.
| | |
|---|---|
| *H01L 29/51* | (2006.01) |
| *H01L 29/861* | (2006.01) |
| *H01L 29/24* | (2006.01) |
| *H01L 29/45* | (2006.01) |
| *H01L 29/06* | (2006.01) |
| *H01L 23/31* | (2006.01) |
| *H01L 23/29* | (2006.01) |

(52) U.S. Cl.
CPC ............ *H01L 29/861* (2013.01); *H01L 23/291* (2013.01); *H01L 23/3171* (2013.01); *H01L 29/0611* (2013.01); *H01L 29/0684* (2013.01); *H01L 29/24* (2013.01); *H01L 29/45* (2013.01)

(58) Field of Classification Search
USPC .......................................................... 257/43
See application file for complete search history.

(56) References Cited

U.S. PATENT DOCUMENTS

| | | | | |
|---|---|---|---|---|
| 5,399,511 | A * | 3/1995 | Taka ................... | H01L 29/7378 257/E21.371 |
| 5,930,627 | A * | 7/1999 | Zhou ................. | H01L 27/11521 257/E21.682 |
| 7,955,995 | B2 * | 6/2011 | Kakehata .............. | H01L 27/115 257/E21.471 |
| 9,209,078 | B2 * | 12/2015 | Spencer ............ | H01L 21/76885 |
| 2011/0115021 | A1 * | 5/2011 | Dennard ........... | H01L 21/76232 257/347 |
| 2012/0007097 | A1 * | 1/2012 | Hebert ................ | H01L 29/0619 257/76 |
| 2012/0326159 | A1 * | 12/2012 | Bergmann ............ | H01L 33/405 257/76 |
| 2016/0020266 | A1 * | 1/2016 | Park .................... | H01L 27/3276 257/40 |

* cited by examiner

*Primary Examiner* — Thao P Le

(57) ABSTRACT

Metal oxynitride diodes having at least a first metal oxynitride layer of a first conduction type and a second metal oxynitride layer of a second conduction type are provided. The first oxynitride layer is selectively doped or un-intentionally doped and have high carrier mobility. The second oxynitride layer is also selectively doped or un-intentionally doped and have high carrier mobility. A compensated oxynitride drift layer having a low carrier density may be adopted to increase the breakdown voltage of the device.

15 Claims, 3 Drawing Sheets

METAL OXYNITRIDE DIODE DEVICES

FIELD OF INVENTION

This invention relates to diodes having at least a first metal oxynitride layer and a second metal oxynitride layer for forming a switching or rectification electronic circuit.

BACKGROUND OF THE INVENTION

Junction diodes are important devices in electronic circuits for rectification, switching and protection. They are often formed using element semiconductors such as Si, Ge and compound semiconductors such as GaAs and InP. For efficient rectification or switching, the charge carrier mobility and breakdown electric filed of the materials used should be sufficiently high. The unwanted series resistances in ON state should be low so that the energy loss in the diodes is kept low during operation. The present invention provides structures of diodes based on metal oxynitride semiconductor.

SUMMARY OF THE INVENTION

One objective of the invention is to provide an metal oxynitride diode device for electrical rectification and switching.

Another objective of the invention is to provide an metal oxynitride diode device with a first metal oxynitride layer and a second metal oxynitride layer.

Yet another objective of the invention is to provide an metal oxynitride diode device with a first metal oxynitride layer, an metal oxynitride drift layer and a second metal oxynitride layer to increase the breakdown voltage of the metal oxynitride diode device.

DETAIL DESCRIPTION OF THE PREFERRED EMBODIMENTS

Figure 1A:
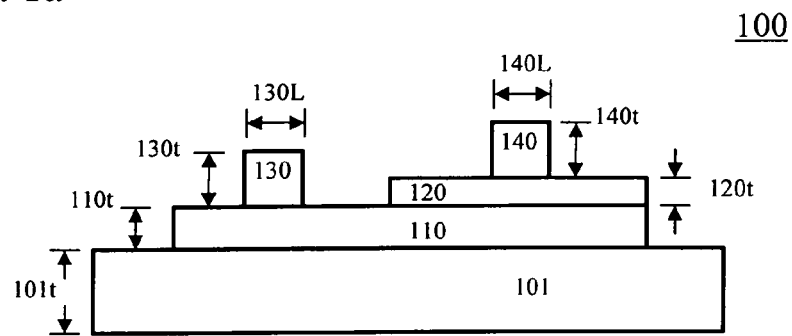
FIG. 1a A schematic cross sectional view shows a metal oxynitride diode (100) having a substrate (101), a first metal oxynitride layer (110), a second metal oxynitride layer (120), a first contact layer (130) and a second contact layer (140).

According one embodiment of this invention, a metal oxynitride diode (100) for forming a switching or rectification electronic circuit is provided in FIG. 1a. It comprises a substrate (101) having a substrate thickness (101t); a first metal oxynitride layer (110) with a first metal oxynitride conduction type, a first metal oxynitride energy band gap $E_{g1}$, a first metal oxynitride electron affinity $\chi_1$ and a first metal oxynitride thickness (110t); a second metal oxynitride layer (120) having a second metal oxynitride conduction type, a second metal oxynitride energy band gap $E_{g2}$, a second metal oxynitride electron affinity $\chi_2$ and a second metal oxynitride thickness (120t); a first contact layer (130) with a first contact layer thickness (130t) and a first contact layer length (130L); a second contact layer (140) with a second contact layer thickness (140t) and a second contact layer length (140L). The first contact layer (130) is in direct contact with the first metal oxynitride layer (110) and the second contact layer (140) is in direct contact with the second metal oxynitride layer (120). The first metal oxynitride conduction type and the second metal oxynitride conduction type is opposite.

Figure 1B:
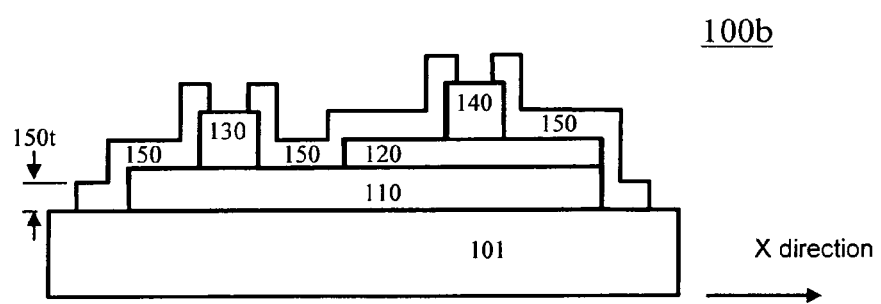
FIG. 1b A schematic cross sectional diagram shows a metal oxynitride diode (100b) having a first metal oxynitride layer (110), a second metal oxynitride layer (120), a first contact layer (130), a second contact layer (140) and a first passivation layer (150).

According to another embodiment of the present invention and as shown in FIG. 1b, a first passivation layer (150) with a passivation layer thickness (150t) is preferably adopted to a metal oxynitride diode (100b) to improve thermal stability of the device. The first passivation layer (150) covers a portion of the first contact layer (130) and a portion of the second contact layer (140). It also covers the exposed regions of the first metal oxynitride layer (110) (or regions not covered by the second metal oxynitride layer (120) and the first contact layer (130)) and the exposed regions of the second metal oxynitride layer (120) (or regions not covered by the second contact layer (140)). Materials of the first passivation layer (150) may be selected from a group including: silicon oxide, silicon nitride, silicon oxynitride, aluminum oxide, aluminum nitride, hafnium dioxide, gallium oxide, barium strontium titanite and their combinations. The first passivation layer thickness (150t) is preferred to be in a range of 50 nm to 2000 nm.

In order to obtain high charge carrier mobilities, the metals forming the first metal oxynitride layer (110) are selected from a group including: In, Zn, Sn, Ga, Ba, La, Al, Mg and their alloys. Some material examples of the metal oxynitrides are: $InO_yN_{1-y}$, $In_xSn_{1-x}O_yN_{1-y}$, $In_xZn_{1-x}O_yN_{1-y}$, $In_xGa_{1-x}O_yN_{1-y}$, $In_xMg_{1-x}O_yN_{1-y}$, $Sn_xZn_{1-x}O_yN_{1-y}$, $Sn_xBa_{1-x}O_yN_{1-y}$, $Sn_x(Ba,La)_{1-x}O_yN_{1-y}$, where $0 \leq x \leq 1$ and $0 \leq y \leq 1$. The exact values of x and y for best performance of the present metal oxynitride diodes are largely determined by the material combinations. The charge carrier mobility is also affected by other factors. For instance, the carrier mobility is dependent on the donor densities. Even with the same stoichiometric composition, two films with different donor concentrations will have different charge carrier mobilities. Take $InO_yN_{1-y}$ as an example, the free electron mobility in a indium oxynitride film with a large y value increases by a factor of 20 to 100 when the donor concentration (whether intentional or un-intentional) in the indium oxynitride film is decreased from $5\times10^{20}$ cm$^{-3}$ to $5\times10^{17}$ cm$^{-3}$.

Furthermore, the charge carrier mobilities of metal oxynitrides having different nitrogen contents (or 1−y values) are also different. Comparing to a room temperature charge carrier mobility value of about 100 cm$^2$/V-sec for an $In_2O_3$ film, room temperature charge carrier mobility for an $InO_yN_{1-y}$ film with a similar donor concentration and crystalline quality will be as high as 2,000 cm$^2$N-sec. For crystalline $InO_yN_{1-y}$ with y<0.4, the charge carrier mobility will be more than 500 cm$^2$/V-sec. Similar performance can also be implemented using the following combinations: $In_xSn_{1-x}O_yN_{1-y}$, $In_xGa_{1-x}O_yN_{1-y}$, $In_xGa_{1-x}O_yN_{1-y}$, $In_xMg_{1-x}O_yN_{1-y}$, $Sn_xZn_{1-x}O_yN_{1-y}$, $Sn_xBa_{1-x}O_yN_{1-y}$, and $Sn_x(Ba,La)_{1-x}O_yN_{1-y}$ as the first metal oxynitride layer (110), with 0≤x≤1 and 0≤y≤1.

It is noted that in order to maintain a high charge carrier mobility, the donor density in the first metal oxynitride layer (110) should be kept to be less than $10^{18}$ cm$^{-3}$. On the other hand, in order not to have too high a resistance for the first metal oxynitride layer (110) along the substrate surface or along a X direction (as shown in FIG. 1b), the donor density should not be too low. Once the values of x and y for material of the first metal oxynitride layer (110) have been selected, both the first metal oxynitride energy band gap $E_{g1}$ and the first metal oxynitride electron affinity $\chi_1$ are specified. In most cases, impurity doping atoms or defects are selected so that the conduction type of the first metal oxynitride layer (110) is p-type and that of the second metal oxynitride layer (120) is n-type. Alternately, the conduction type of the first metal oxynitride layer (110) may also be selected as n-type by selecting proper impurity doping atoms or defects.

The first metal oxynitride thickness (110t) is selected to be in a range of 50 nm~2000 nm and more preferably to be in a range of 100 nm~1000 nm, provided that both the charge carrier mobility in the first metal oxynitride layer and the breakdown voltage of the device are sufficiently high, and the rectification ratio of the diode is also high to ensure a ratio between the OFF state resistance $R_{OFF}$ and the ON state resistance $R_{ON}$ to be no less than $10^3$ or more preferably $R_{OFF} \geq 10^6 R_{ON}$.

In order to obtain high charge carrier mobilities, metals for forming the second metal oxynitride layer (120) are selected from a group of: In, Zn, Sn, Ga, Ba, La, Al, Mg and their alloys. Material examples for the second metal oxynitride layer may include: $InO_yN_{1-y}$, $In_xSn_{1-x}O_yN_{1-y}$, $In_xZn_{1-x}O_yN_{1-y}$, $In_xGa_{1-x}O_yN_{1-y}$, $In_xMg_{1-x}O_yN_{1-y}$, $Sn_xZn_{1-x}O_yN_{1-y}$, $Sn_xBa_{1-x}O_yN_{1-y}$, $Sn_x(Ba,La)_{1-x}O_yN_{1-y}$, here 0≤x≤1 and 0≤y≤1. The exact values of x and y for best performance of the present metal oxynitride diodes are determined by the material combination and other factors. For instance, the carrier mobility is dependent on the donor density. Even with the same stoichiometric composition, two films with different donor concentrations will have different charge carrier mobilities. Furthermore, the mobilities of metal oxynitrides having different nitrogen contents (or 1−y values) are also different. Once the values of x and y for the material of the second metal oxynitride layer (120) have been selected, both the second metal oxynitride energy band gap $E_{g2}$ and the second metal oxynitride electron affinity $\chi_2$ are specified. In most cases, impurity doping atoms or defects are selected so that the conduction type of the second metal oxynitride layer (120) is n-type. Alternately, the conduction type may also be selected as p-type by selecting proper impurity doping atoms or defects.

The second metal oxynitride thickness (120t) is selected to be in a range of 50 nm~2000 nm and more preferably to be in a range of 100 nm~1000 nm, provided that both the mobility of free charge carriers in (120) and the breakdown voltage of the device are sufficiently high, and the rectification ratio of the diode is also high to ensure a ratio between OFF state resistance $R_{OFF}$ and ON state resistance $R_{ON}$ to be no less than $10^3$ or more preferably to achieve $R_{OFF} \geq 10^6 R_{ON}$.

For the metal oxynitride diodes for forming a switching or rectification electronic circuit, the substrate (101) may be selected from a group including: glass plates, plastic sheets, alumina plates, aluminum nitride plates, stainless steel sheets, silicon wafer, Si and GaAs substrates with prefabricated digital and analog microelectronic circuits.

Figure 2:
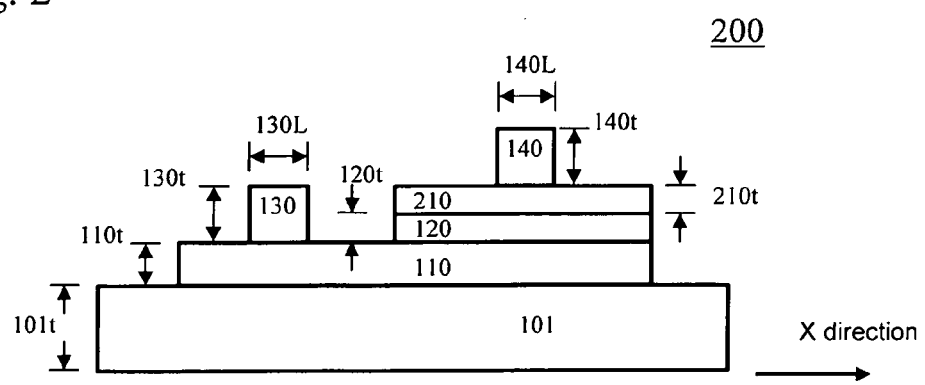
FIG. 2 A schematic cross sectional diagram illustrating a metal oxynitride diode (200) having a first metal oxynitride layer (110), a second metal oxynitride layer (120), a first contact layer (130), a second contact layer (140) and a second contact insulating layer (210).

According to yet another embodiment of this invention and as shown in FIG. 2, a metal oxynitride diode (200) for forming a switching or rectification electronic circuit and with reduced leakage current is provided. The metal oxynitride diode (200) comprises a substrate (101) with a substrate thickness (101t); a first metal oxynitride layer (110) with a first metal oxynitride conduction type, a first metal oxynitride energy band gap $E_{g1}$, a first metal oxynitride electron affinity $\chi_1$ and a first metal oxynitride thickness (110t); a second metal oxynitride layer (120) having a second metal oxynitride conduction type, a second metal oxynitride energy band gap $E_{g2}$, a second metal oxynitride electron affinity $\chi_2$ and a second metal oxynitride thickness (120t); a first contact layer (130) with a first contact layer thickness (130t) and a first contact layer length (130L); a second contact layer (140) with a second contact layer thickness (140t) and a second contact layer length (140L). The metal oxynitride diode (200) further comprises a second contact insulating layer (210) having a second contact insulating layer thickness (210t), between the second metal oxynitride layer (120) and the second contact layer (140), forming an MIS structure to reduce leakage currents from the second contact layer (140) when diode is in a OFF state. Materials of the second contact insulating layer (210) may be selected from a group including: silicon dioxide ($SiO_2$), silicon nitride ($Si_3N_4$), silicon oxynitride, aluminum oxide ($Al_2O_3$), aluminum nitride (AlN), hafnium oxide ($HfO_2$), gallium oxide ($Ga_2O_3$), barium strontium titanite and their mixtures, so long as the second contact insulating layer (210) has a large breakdown voltage, a low leakage current and preferably has negative or low positive fixed insulating charges. The second contact insulating layer thickness (210t) is selected according to the breakdown voltage and operating frequency requirements and is often less than 50 nm and more preferably less than 25 nm.

In order to achieve a low resistance contact to a p-type first metal oxynitride layer (110), according to another embodiment of the invention, materials of the first contact layer (130) are selected from a group of large work function metals: Ni, W, Mo, Ta, Pt, Cu, Al, Au and their alloys so that a low resistance contact is formed between the first contact layer (130) and the p-type first metal oxynitride layer (110). In contrast, in order to achieve a low resistance contact to a n-type second metal oxynitride layer (120), material of the second contact layer (140) are selected from a group of low work function metals. The first contact layer thickness (130t) may be selected in the range of 200 nm~3,000 nm or larger, dependent on the power handling capability and operating frequency requirements.

It should be pointed out that in forming either the first or the second contact layers (130, 140), the first metal material to put down and to make contact with the surface of a p-type metal oxynitride layer should have a work function as large as possible, such as Ni, Pt, Au etc. On the other hand, the first metal material to put down and make contact with the surface of a n-type metal oxynitride layer should have a low work function, so that a non rectifying contact with low resistance is formed between the n-type metal oxynitride layer and the contact layer.

Figure 3:
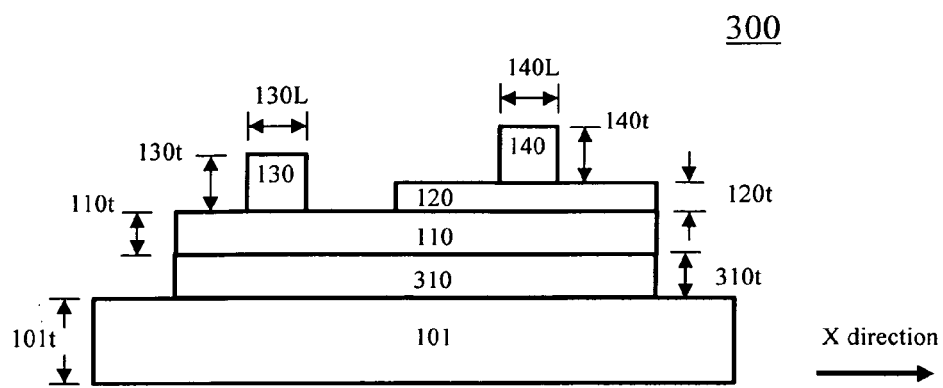
FIG. 3 A schematic cross sectional diagram showing a metal oxynitride diode (300) with a first metal oxynitride layer (110), a second metal oxynitride layer (120), a first contact layer (130), a second contact layer (140) and a first conductive layer (310) to reduce unwanted series resistance of the first metal oxynitride layer in the X direction.

In order to reduce unwanted series resistance associated with the first metal oxynitride layer (110) in the X direction in a metal oxynitride diode (300) especially in the case of a non-conducting substrate (101) is used, according to one embodiment of the present invention and as depicted in FIG. 3, a first conductive layer (310) having a first conductive layer thickness (310t) is introduced between the substrate (101) and the first metal oxynitride layer (110). Material of the first conductive layer (310) may be selected from a group including: Au, Al, Cu, Ag, Ti, W, Mo, Ta, Cr, doped metal oxynitrides and their combinations. When metals are selected for the first conductive layer (310) for a p-type first metal oxynitride layer (110), the last metal material to put down in the first conductive layer (310) and to contact the bottom surface of the first metal oxynitride layer (110) should have a work function as high as possible, such as Ni, Pt, Au etc. When the first metal oxynitride layer (110) is n-type, the last metal to put down and to contact the bottom surface of the first metal oxynitride layer (110) should have a small enough work function, such as Ti, Al etc. The first conductive layer thickness (310t) may be selected to be in the range of 200 nm~3,000 nm or larger, dependent on the power handling capability and operating frequency requirements.

Figure 4:
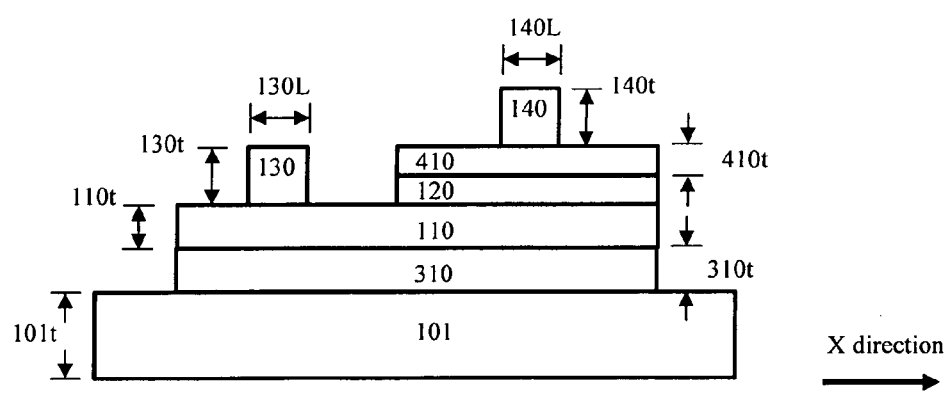
FIG. 4 A schematic cross sectional view depicting a metal oxynitride diode (400) with a first metal oxynitride layer (110), a second metal oxynitride layer (120), a first contact layer (130), a second contact layer (140), a first conductive layer (310) and a second conductive layer (410). The second conductive layer is introduced to reduce unwanted series resistance of the second metal oxynitride layer in the X direction.

In order to reduce unwanted series resistance associated with the second metal oxynitride layer (120) in X direction in a metal oxynitride diode, according to yet another embodiment of this invention and as shown in FIG. 4, a metal oxynitride diode (400) for forming a switching or rectification electronic circuit is provided. The metal oxynitride diode (400) comprises a substrate (101) with a substrate thickness (101t); a first metal oxynitride layer (110) with a first metal oxynitride conduction type, a first metal oxynitride energy band gap $E_{g1}$, a first metal, oxynitride electron affinity $\chi_1$ and a first metal oxynitride thickness (110t); a second metal oxynitride layer (120) having a second metal oxynitride conduction type, a second metal oxynitride energy band gap $E_{g2}$, a second metal oxynitride electron affinity $\chi_2$ and a second metal oxynitride thickness (120t); a first conductive layer (310) with a first conductive layer thickness (310t); a first contact layer (130) with a first contact layer thickness (130t) and a first contact layer length (130L); a second contact layer (140) with a second contact layer thickness (140t) and a second contact layer length (140L). The metal oxynitride diode (400) further comprises a second conductive layer (410) having a second conductive layer thickness (410t) introduced between the second metal oxynitride layer (120) and the second contact layer (140). Material of the second conductive layer (410) may be selected from a group including: Au, Al, Cu, Ag, Ti, W, Mo, Ta, Cr, doped metal oxynitrides and their combinations.

When metals are selected for the second conductive layer (410) for an n-type second metal oxynitride layer (120), the first metal selected for the second conductive layer (410) to put down and to make contact with the top surface of the second metal oxynitride layer (120) should have a small enough work function, such as Ti, Al etc. When the second metal oxynitride layer (120) is p-type, the first metal to put down in the second conductive layer (410) and to contact the top surface of the second metal oxynitride layer (120) should have a work function as large as possible, such as Ni, Pt, Au etc. The second contact layer thickness (410t) may be selected in the range of 200 nm to 3,000 nm or larger, dependent on the power handling capability and operating frequency requirements for the metal oxynitride diode (400).

Figure 5:
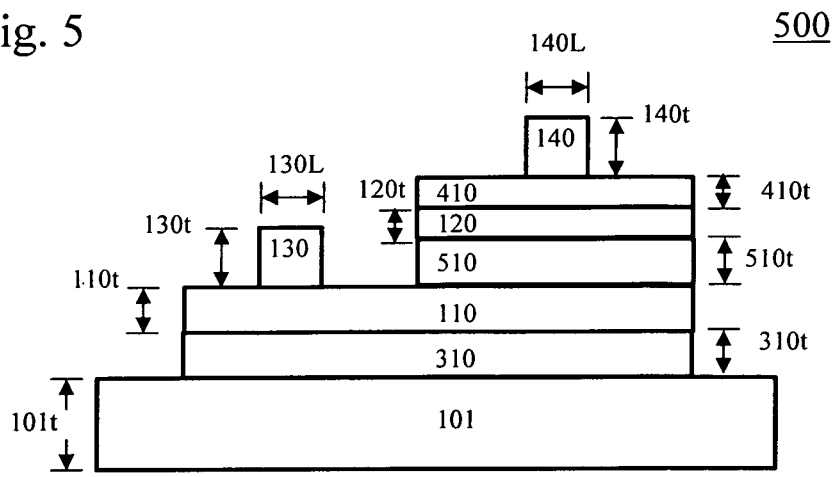
FIG. 5 A schematic cross sectional diagram showing a metal oxynitride diode (500) having a first metal oxynitride layer (110), a second metal oxynitride layer (120), a first conductive layer (310), a second conductive layer (410), a first contact layer (130), a second contact layer (140) and a first drift layer (510). The first drift layer is introduced to increase breakdown voltage and to reduce the capacitance of the diode.

In order to increase further the reverse breakdown voltage and the power handling capability of a metal oxynitride diode, according to this invention and as shown in FIG. 5, a metal oxynitride diode (500) for forming a switching or rectification electronic circuit is provided. The metal oxynitride diode (500) comprises a substrate (101) with a substrate thickness (101t); a first metal oxynitride layer (110) with a first metal oxynitride conduction type, a first metal oxynitride energy band gap $E_{g1}$, a first metal oxynitride electron affinity $\chi_1$ and a first metal oxynitride thickness (110t); a second metal oxynitride layer (120) having a second metal oxynitride conduction type, a second metal oxynitride energy band gap $E_{g2}$, a second metal oxynitride electron affinity $\chi_2$ and a second metal oxynitride thickness (120t); a first conductive layer (310) with a first conductive layer thickness (310t); a second conductive layer (410) with a second conductive layer thickness (410t); a first contact layer (130) with a first contact layer thickness (130t) and a first contact layer length (130L); a second contact layer (140) with a second contact layer thickness (140t) and a second contact layer length (140L). The metal oxynitride diode (500) further comprises a first drift layer (510) having a first drift layer thickness (510t) introduced between the first metal oxynitride layer (110) and the second metal oxynitride layer (120). The first drift layer thickness (510t) is selected to be in a range of: 50 nm~1,000 μm to increase breakdown voltage between the first contact (130) and the second contact (140). The adoption of the first drift layer (510) also decrease the capacitance between the first contact layer (130) and the second contact layer (140) so that the amount of charges involved during switching from ON to OFF state and from OFF to ON state is reduced.

It is preferable to have the composition of the first drift layer (510) to be the same as or similar to that of the first metal oxynitride layer (110). The metals of the first drift layer (510) may be selected from a group of: In, Zn, Sn, Ga, Ba, La, Al, Mg and their alloys. Some examples of the materials for the first drift layer (510) are: $InO_yN_{1-y}$, $In_xSn_{1-x}O_yN_{1-y}$, $In_xZn_{1-x}O_yN_{1-y}$, $In_xGa_{1-x}O_yN_{1-y}$, $In_xMg_{1-x}O_yN_{1-y}$, $Sn_xZn_{1-x}O_yN_{1-y}$, $Sn_xBa_{1-x}O_yN_{1-y}$, $Sn_x(Ba,La)_{1-x}O_yN_{1-y}$, with $0 \leq x \leq 1$ and $0 \leq y \leq 1$. The material of the first drift layer (510) may also be compensated so that carrier concentration in the first drift layer (510) may be kept as low as possible, preferably less than $10^{17}$ cm$^3$ and more preferably less than $10^{16}$ cm$^{-3}$.

Figure 6:
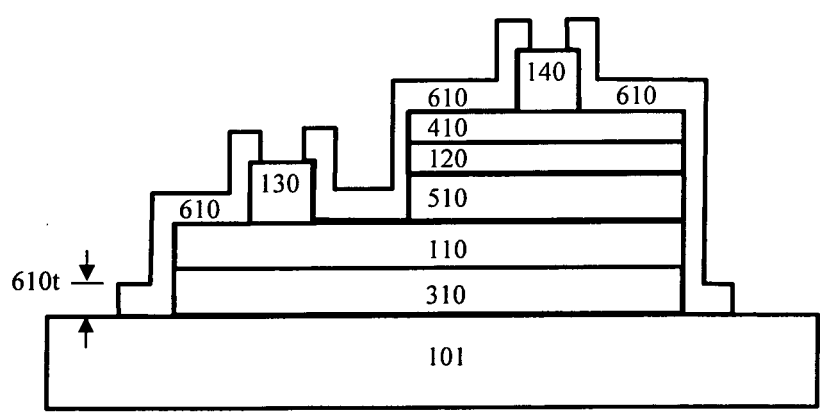
FIG. 6 A schematic cross sectional diagram shows a metal oxynitride diode (600) having a first metal oxynitride layer (110), a second metal oxynitride layer (120), a first conductive layer (310), a second conductive layer (410), a first drift layer (510), a first contact layer (130), a second contact layer (140) and a second passivation layer (610) to improve operation thermal stability of the diode.

In order to achieve thermal stability in a metal oxynitride diode, according to one embodiment of this invention and as shown in FIG. 6, a second passivation layer (610) with a second passivation layer thickness (610t) is introduced in the metal oxynitride diode (500) in FIG. 5 and form a metal oxynitride diode (600) with better thermal stability. This second passivation layer (610) covers a portion of the first contact layer (130), a portion of the second contact layer (140), exposed regions of the first metal oxynitride layer (110) and the second oxynitride layer (120). Material of the passivation layer (610) may be selected from a group including: silicon oxide, silicon nitride, silicon oxynitride, aluminum oxide, aluminum nitride, hafnium dioxide, gallium oxide, barium strontium titanite and their combinations. The second passivation layer thickness (610t) is preferred to be in a range of 50 nm to 2000 nm.

For the present metal oxynitride diodes for forming a switching or rectification electronic circuit, the substrate (101) may be selected from a group including: glass plates, plastic sheets, alumina plates, aluminum nitride plates, stainless steel sheets, silicon wafer, Si and GaAs substrates with prefabricated digital and analog microelectronic circuits.

What is claimed is:

1. A metal oxynitride diode for forming a switching or rectification electronic circuit, comprises
    a substrate having a substrate thickness;
    a first metal oxynitride layer having a first metal oxynitride conduction type, a first metal oxynitride energy band gap, a first metal oxynitride electron affinity and a first metal oxynitride thickness;
    a second metal oxynitride layer having a second metal oxynitride conduction type, a second metal oxynitride energy band gap, a second metal oxynitride electron affinity and a second metal oxynitride thickness, wherein said second metal oxynitride conduction type is opposite to said first metal oxynitride conduction type;
    a first contact layer having a first contact layer thickness to contact said first metal oxynitride layer; and
    a second contact layer having a second contact layer thickness to contact said second metal oxynitride layer.

2. A metal oxynitride diode for forming a switching or rectification electronic circuit as defined in claim 1, wherein metals for forming said first metal oxynitride layer are selected from a group of: In, Zn, Sn, Ga, Ba, La, Al, Mg, Ca, Sr, Ba and their alloys.

3. A metal oxynitride diode for forming a switching or rectification electronic circuit as defined in claim 1, wherein metals for forming said second metal oxynitride layer are selected from a group of: In, Zn, Sn, Ga, Ba, La, Al, Mg, Ca, Sr, Ba and their alloys.

4. A metal oxynitride diode for forming a switching or rectification electronic circuit as defined in claim 1, further comprising a second contact insulating layer having a second contact insulating layer thickness introduced between said second metal oxynitride layer and said second contact layer, forming an MIS structure to reduce leakage currents between said first contact layer and second contact layer, materials of said second contact insulating layer may be selected from a group including: silicon oxide, silicon nitride, silicon oxynitride, aluminum oxide, aluminum nitride, gallium oxide, barium strontium titanite, hafnium dioxide and their mixtures, wherein said second contact insulating layer thickness is selected to be less than 50 nm and more preferably less than 25 nm.

5. A metal oxynitride diode for forming a switching or rectification electronic circuit as defined in claim 1, wherein said first metal oxynitride layer is p-type and material of said first contact layer is selected from a group of high work function metals including Ni, W, Mo, Ta, Pt, Cu, Al, Au and their alloys to form a low resistance contact between said first contact layer and said first metal oxynitride layer, whereas material of said second contact layer is selected from a group of low work function metals such as Ti and Al to form a low resistance contact between said second contact and said second metal oxynitride layer.

6. A metal oxynitride diode for forming a switching or rectification electronic circuit as defined in claim 1, wherein said second metal oxynitride layer is p-type and material of said second contact layer is selected from a group of high work function metals including Ni, W, Mo, Ta, Pt, Cu, Al, Au and their alloys to form a low resistance contact between said second contact layer and said second metal oxynitride layer, whereas material of said first contact layer is selected from a group of low work function metals such as Ti and Al to form a low resistance contact between said first contact layer and said first metal oxynitride layer.

7. A metal oxynitride diode for forming a switching or rectification electronic circuit as defined in claim 1, wherein said first metal oxynitride layer is p-type and at least a first metal material of said first contact layer to contact a surface of said first metal oxynitride layer should have a work function as high as possible such as Ni, Pt, Au and their alloys to form a low resistance contact between said first contact layer and said first metal oxynitride layer, whereas at least a first metal material of said second contact layer to contact a surface of said second metal oxynitride layer should have a low work function to form a low resistance contact between said second contact layer and said second metal oxynitride layer.

8. A metal oxynitride diode for forming a switching or rectification electronic circuit as defined in claim 1, wherein said second metal oxynitride layer is p-type and at least a first metal material of said second contact layer to contact a surface of said second metal oxynitride layer should have a work function as high as possible such as Ni, Pt, Au and their alloys to form a low resistance contact between said second contact layer and said second metal oxynitride layer, whereas at least a first metal material of said first contact layer to contact a surface of said first metal oxynitride layer should have a low work function to form a low resistance contact between said first contact layer and said first metal oxynitride layer.

9. A metal oxynitride diode for forming a switching or rectification electronic circuit as defined in claim 1, further comprising a first conductive layer having a first conductive layer thickness between said substrate and said first metal oxynitride layer to reduce unwanted series resistance associated with said first metal oxynitride layer, material of said first conductive layer is selected from a group of: Ni, Au, Al, Cu, Ag, Pt, Ti, W, Mo, Ta, Cr, doped metal oxynitrides and their combinations.

10. A metal oxynitride diode for forming a switching or rectification electronic circuit as defined in claim 1, further comprising a second conductive layer having a second conductive layer thickness between said second metal oxynitride layer and said second contact layer to reduce unwanted series resistance associated with said second metal oxynitride layer, material of said second conductive layer may be selected from a group of: Ni, Au, Al, Cu, Ag, Pt, Ti, W, Mo, Ta, Cr, doped metal oxynitrides and their combinations.

11. A metal oxynitride diode for forming a switching or rectification electronic circuit as defined in claim 1, further comprising a first drift layer having a first drift layer thickness deposited between said first metal oxynitride layer and said second metal oxynitride layer to increase breakdown voltage and to decrease capacitance of said metal oxynitride diode, wherein charge carrier concentration of said first drift layer is kept as low as possible and material of said first drift layer may be selected to be the same as that of said first metal oxynitride layer, said first drift layer thickness is selected to be in a range of: 50 nm~1,000 nm.

12. A metal oxynitride diode for forming a switching or rectification electronic circuit as defined in claim 1, further comprising a passivation layer having a passivation layer thickness covering exposed regions of said first metal oxynitride layer, exposed regions of said second metal oxynitride layer, a portion of said first contact layer and a portion of said second contact layer, material of said passivation layer may be selected from a group including: silicon oxide, silicon nitride, silicon oxynitride, aluminum oxide, aluminum nitride, gallium oxide, barium strontium titanite, hafnium dioxide and their combinations.

13. A metal oxynitride diode for forming a switching or rectification electronic circuit as defined in claim 1, wherein said substrate is selected from group: glass sheet, plastic sheet, alumina sheet, aluminum nitride sheet, stainless sheet, silicon, gallium arsenide, and silicon and gallium arsenide substrates with prefabricated digital and analog microelectronic circuits.

14. A metal oxynitride diode for forming a switching or rectification electronic circuit as defined in claim 1, wherein said first metal oxynitride thickness is selected to be in a range of 50 nm~2000 nm and more preferably to be in a range of 100 nm~1000 nm.

15. A metal oxynitride diode for forming a switching or rectification electronic circuit as defined in claim 1, wherein said second metal oxynitride thickness is selected to be in a range of 50 nm~2000 nm and more preferably to be in a range of 100 nm~1000 nm.

* * * * *